(12) United States Patent
Huggins

(10) Patent No.: US 6,891,388 B2
(45) Date of Patent: May 10, 2005

(54) LEAD PROTRUSION TESTER

(75) Inventor: Michael C. Huggins, Greentown, IN (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 10/230,021

(22) Filed: Aug. 28, 2002

(65) Prior Publication Data

US 2004/0041577 A1 Mar. 4, 2004

(51) Int. Cl.[7] ............................................. G01R 31/02
(52) U.S. Cl. ................................. 324/761; 324/158.1
(58) Field of Search ........................... 324/73.1, 158.1, 324/761–762, 537; 340/635; 250/231.6, 231.1

(56) References Cited

U.S. PATENT DOCUMENTS 4,463,310 A * 7/1984 Whitley ..................... 324/758
4,833,396 A * 5/1989 Haberland .................. 324/537
6,406,194 B1   6/2002 Neale, III et al.

* cited by examiner

*Primary Examiner*—Vinh P. Nguyen
(74) *Attorney, Agent, or Firm*—Jimmy L. Funke; Stefan V. Chmielewski

(57) ABSTRACT

A lead tester assembly 10 is provided, for use with a circuit board 12 populated with a plurality of electronic components 18 each including at least one lead 20 protruding through the circuit board 16. A conductive plate element 32 is positioned below the circuit board 16 and is movable between a test active position 24 and a test inactive position 26. At least one sleeve element 38 is mounted to and is in electrical communication with the conductive plate element 32. A movable sensor 36 is in electrical communication with the at least one sleeve element 38 when the conductive plate element 32 is in said test inactive position 26. A non-conductive probe 46, slidably positioned within the sleeve element 38, is movable between a lead absent position 50 and a lead present position 52 upon engaging one of the leads 20. The non-conductive probe 46 forces the movable sensor 36 out of electrical communication with the sleeve element 38 when in the lead present position 52.

20 Claims, 4 Drawing Sheets

LEAD PROTRUSION TESTER

TECHNICAL FIELD

The present invention relates generally to a lead protrusion tester. More specifically, the present invention relates to a lead protrusion tester for checking a populated circuit board for lead presence and specified length.

BACKGROUND OF THE INVENTION

Electronic assemblies have played an increasingly important role in a variety of industries and applications. Alongside with their increasing roles, their complexity has increased as well. Modem assemblies often include numerous and diverse electronic components to assist the assembly in providing a wide range of functions. Although this increase in complexity has provided a plurality of benefits, it can also carry with it manufacturing problems. The increasing number of components, tied with an often decreasing assembly size, often results in highly populated circuit boards. The highly populated circuit boards, in turn, can increase the risk of manufacturing errors and associated scrap costs.

One approach to minimization of manufacturing errors on highly populated circuit boards has been to verify the presence of leads protruding through the circuit boards from the plurality of electronic components mounted thereon. One approach to such testing has been to verify lead presence via an in-circuit test passing current through the board and components after soldering. This approach is highly undesirable for a variety of reasons. It commonly requires testing to be performed on a post-soldered circuit board. This makes error correction, part replacement, or the addition of missing parts complex, time consuming and costly as the soldering procedure has already been performed. Secondly, design and manufacturing requirements may require verification and testing of the electronic components prior to such soldering.

Pre-soldering testing and measuring methods have been utilized to verify lead presence and length. Known methods, however, often remain undesirable or impractical for many applications. Lead presence can be verified by approaches that clinch or trim the leads prior to soldering. These approaches, however, can be impractical for many applications and may prove difficult to implement on circuit boards with high component density. Switching probes can be utilized, but they often do not provide the accuracy and repeatability to verify lead length as desired by many applications.

It would therefore be highly desirable to have a lead tester capable of accurately and repeatably verifying the presence and length of a plurality of component leads mounted on a pre-soldered circuit board. It would further be highly desirable to have such a lead tester that could be utilized efficiently and cost-effectively on circuit boards.

SUMMARY OF THE INVENTION

It is, therefore, an object of the present invention to provide a lead tester capable of accurately and repeatably verifying the presence and length of a plurality of component leads mounted on a pre-soldered circuit board.

In accordance with the object of the present invention, a lead tester assembly is provided. The lead tester assembly is intended for use with for use with a circuit board populated with a plurality of electronic components. Each of the plurality of electronic components includes at least one lead protruding through the circuit board. The lead tester assembly includes a conductive plate element movable between a test inactive position and a test active position. At least one sleeve element is mounted to and in electrical communication with the conductive plate element. A movable sensor is in electrical communication with the at least one sleeve element when the conductive plate element is in the test inactive position. A non-conductive probe is slidably positioned within the at least one sleeve element and is movable between a lead absent position and a lead present position. Wherein, upon the non-conductive probe engaging one of the plurality of leads, the non-conductive probe forces the movable sensor out of electrical communication with the at least one sleeve element.

Other objects and features of the present invention will become apparent when viewed in light of the detailed description of the preferred embodiment when taken in conjunction with the attached drawings and appended claims.

DESCRIPTION OF THE PREFERRED EMBODIMENT(S)

Figure 1:
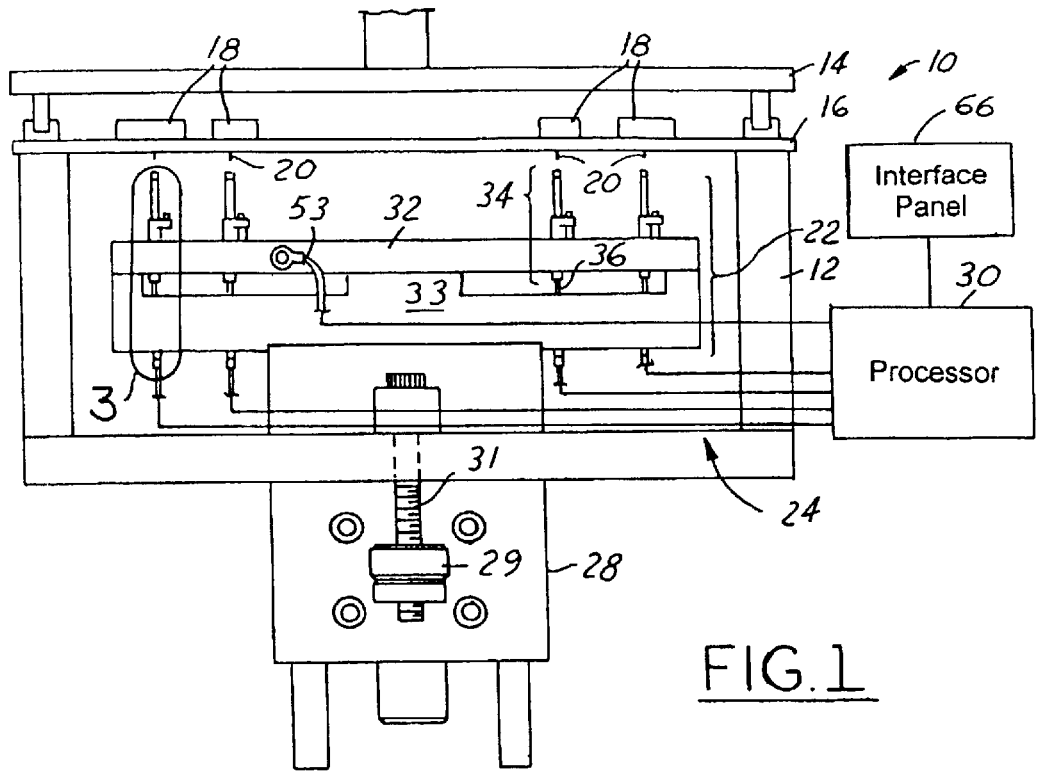
FIG. 1 is an illustration of an embodiment of a lead tester assembly in accordance with tile present invention, the lead tester assembly illustrated in the test inactive position.

Referring now to FIG. 1, which is an illustration of a lead test assembly 10 in accordance with the present invention. The lead test assembly 10 is intended for use within electronics manufacturing assemblies to verify the presence and/or lead length of individual electronic components. Although the present invention was developed under the auspices of the automotive electronics industry, it should be understood that its application would be useful throughout a wide variety of electronics applications.

The lead test assembly 10 includes a base assembly 12 and a securing assembly 14. The securing assembly 14 and the base assembly 12 are utilized to secure a circuit board 16 populated with a plurality of electronic components 18 to the lead test assembly 10. A plurality of lead 20 protrude from the electronic components 18 through the circuit board 16. Often during manufacturing and assembly processes, it becomes desirable to verify the presence and/or length of the leads 20 protruding through the circuit board 16 prior to subjecting the circuit board 16 to soldering. By pre-testing the circuit board 16, part and/or production errors can be corrected while still cost-effective and feasible. The present invention accomplished this verification process through the use of a movable sensor assembly 22 positioned below the circuit board 16.

Figure 2:
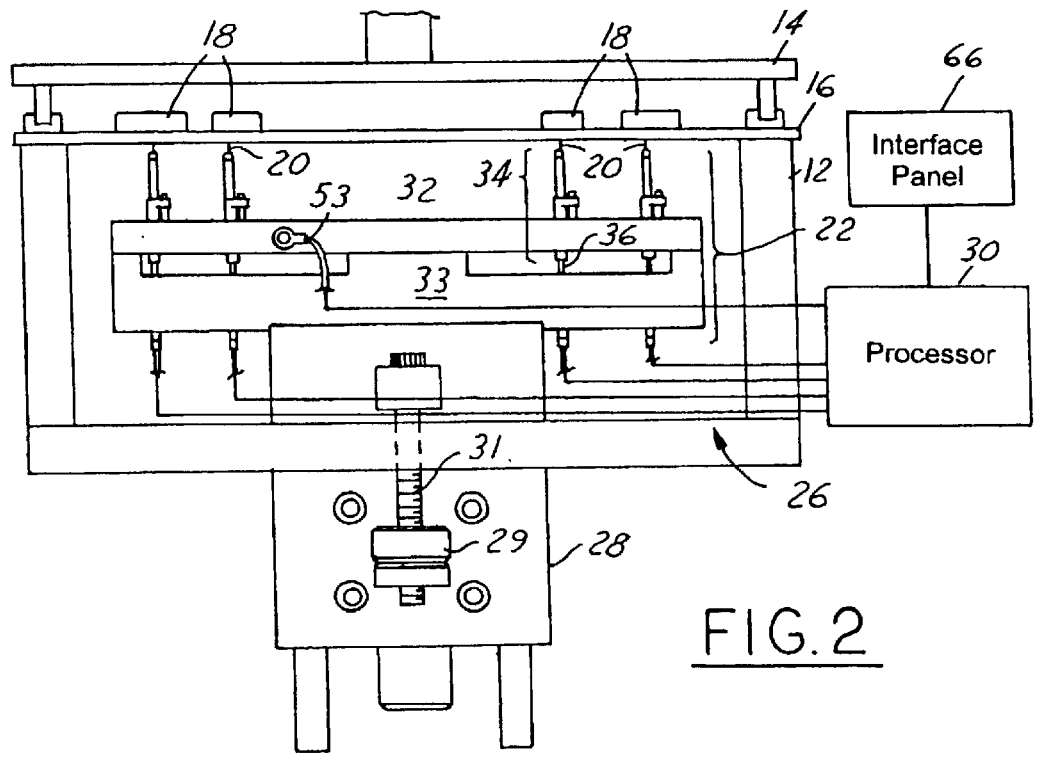
FIG. 2 is an illustration of the lead tester assembly illustrated in FIG. 1, the lead tester assembly illustrated in the test active position.

The movable sensor assembly 22 is movable between a test inactive position 24 (see FIG. 1) and a test active position 26 (see FIG. 2). Although it is contemplated that the movable sensor assembly 22 may be moved between these positions in a variety of fashions, one embodiment contemplates the use of an air slide 28 to move the movable sensor assembly 22. When the movable sensor assembly 22 is moved into the test active position 26, the assembly 22 registers the presence (or lack of) leads 20 and reports those details to a processor 30 such as a PLC input module. By monitoring the position of the movable sensor assembly 22 in relation to the signal registering a lead 20, the minimum length of individual leads 20 may also be verified.

The movable sensor assembly 22 includes a conductive plate element 32 affixed to a sensor mounting base 33. Although a wide variety of conductive plate elements 32 are contemplated by the present invention, one embodiment utilizes a copper plate element 32. The copper plate element 32 serves as a mount for a plurality of probe assemblies 34. The sensor mounting base 34 serves as a mount for a corresponding plurality of movable sensors 36 each of which is paired with one of the plurality of probe assemblies 34. Although a variety of movable sensors 36 are contemplated, one embodiment utilizes spring contact sensors 36. Each of the plurality of probe assembles 34 comprises a conductive sleeve element 38 mounted to and in electrical communication with the conductive plate element 32 (see FIG. 3). A variety of materials may be utilized to form the conductive sleeve element 38, although it is contemplated that a gold plated brass sleeve is preferable. Furthermore, the brass sleeve 38 may include an elbow portion 40 wherein a sleeve spring 42 and sleeve adjustment screw 44 may be mounted. The spring 42 and adjustment screw 44 allow the relative height of individual probe assemblies 34 to be adjusted. Height of the plurality of probe assemblies 34 together can be adjusted by varying the travel of the air slide 28. The air slide 28 preferably has an adjustable stop 29 mounted on a very fine thread 31 to allow for minute stroke adjustments of the entire movable assembly 22.

Figure 3:
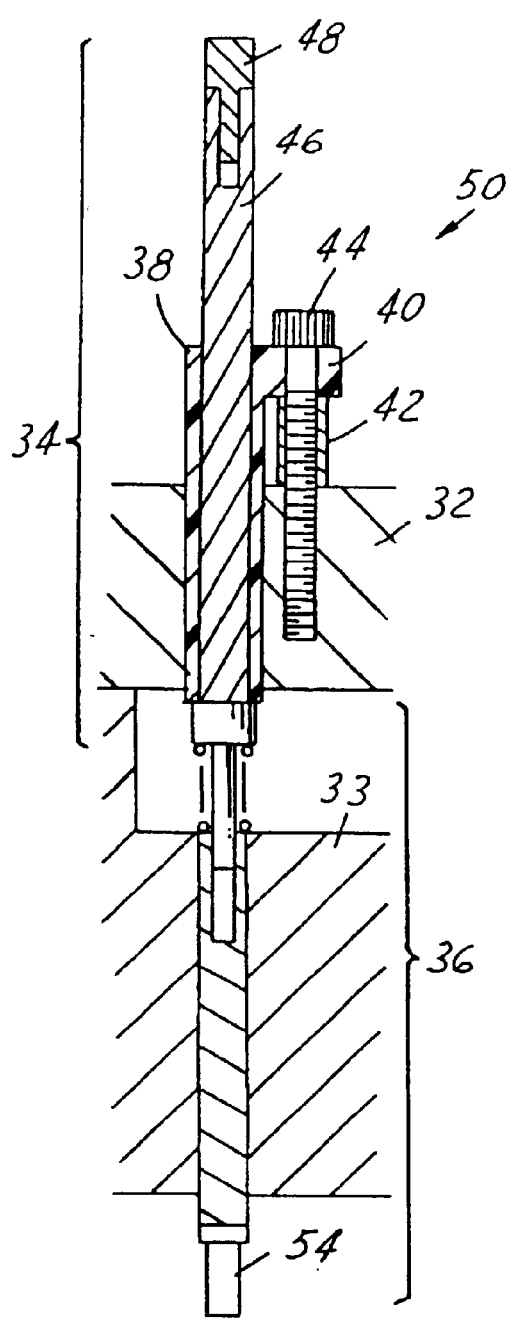
FIG. 3 is a detail illustration of a probe assembly for use in the lead tester assembly illustrated in FIG. 1, the probe assembly illustrated in the lead absent position.
Figure 3A:
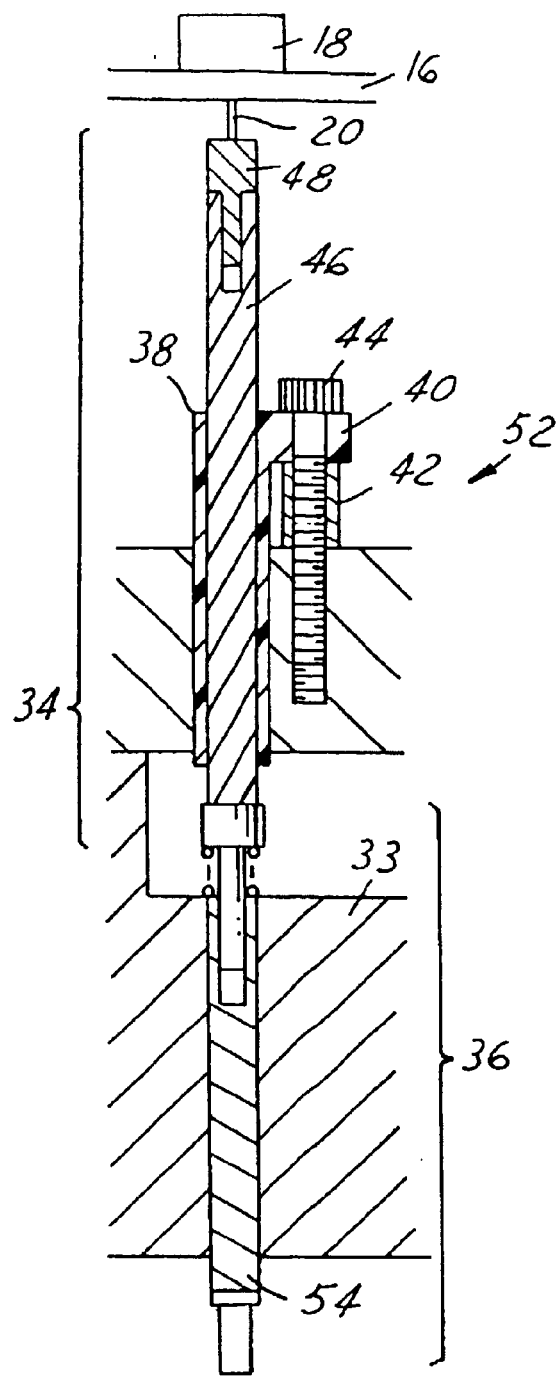
FIG. 3A is a detail illustration of a probe assembly for use in the lead tester assembly illustrated in FIG. 2, the probe assembly illustrated in the lead present position.

A nonconductive probe 46, preferably bakelite, is slidably positioned within the conductive sleeve element 38. The nonconductive probe 46 can include a protective tip 48, such as a hardened steel tip, to protect the nonconductive probe 46 from damage due to repeated contact with leads 20. The nonconductive probe 46 is movable between a lead absent position 50 (see FIG. 3) and a lead present position 52 (see FIG. 3A). When the movable sensor assembly 22 is in the test inactive position 24 or the nonconductive probe 46 is not in contact with a lead 20, the nonconductive probe 46 remains in the lead absent position 50 (FIG. 3). In these scenarios, the spring contact sensor 36 remains in electrical communication with the brass sleeve element 38 and thereby the conductive plate element 32. A conductive plate ground wire 53, running from the conductive plate element 32 to the processor 30, in combination with a sensor wire 54, running from the spring contact sensor 36 to the processor 30, will therefore signal a closed loop indicating no sensed lead 20. When the movable sensor assembly 22 is moved into the test active position 26, however, if the bakelite probe 46 comes into contact with a lead 20, the bakelite probe 46 pushes the spring contact sensor 36 out of electrical communication with the brass sleeve element 38, and thereby the conductive plate element 32 (see FIG. 3B). In this fashion, the processor 30 can sense the presence or absence of a lead 20 at the location of each nonconductive probe 46. By accurately setting the height of the individual probe assemblies 34, the probe assemblies 34 as a group, and the travel of the air slide 28, the processor 30 can accurately verify the length of each lead 20 with improved precision.

Figure 4:
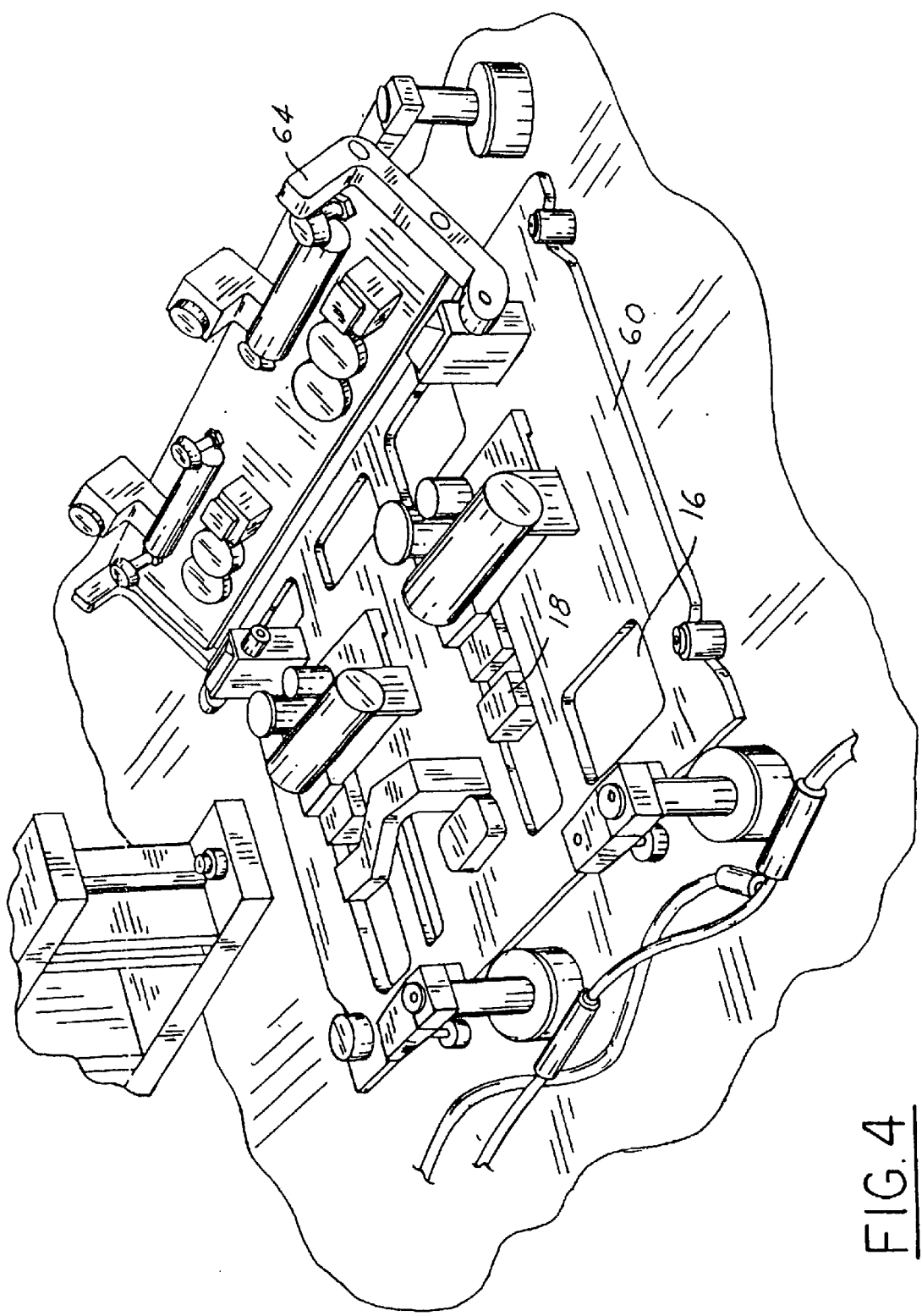
FIG. 4 is a top view detail of the lead test assembly illustrated in FIG. 1, the lead test assembly illustrated in a board loaded position.
Figure 5:
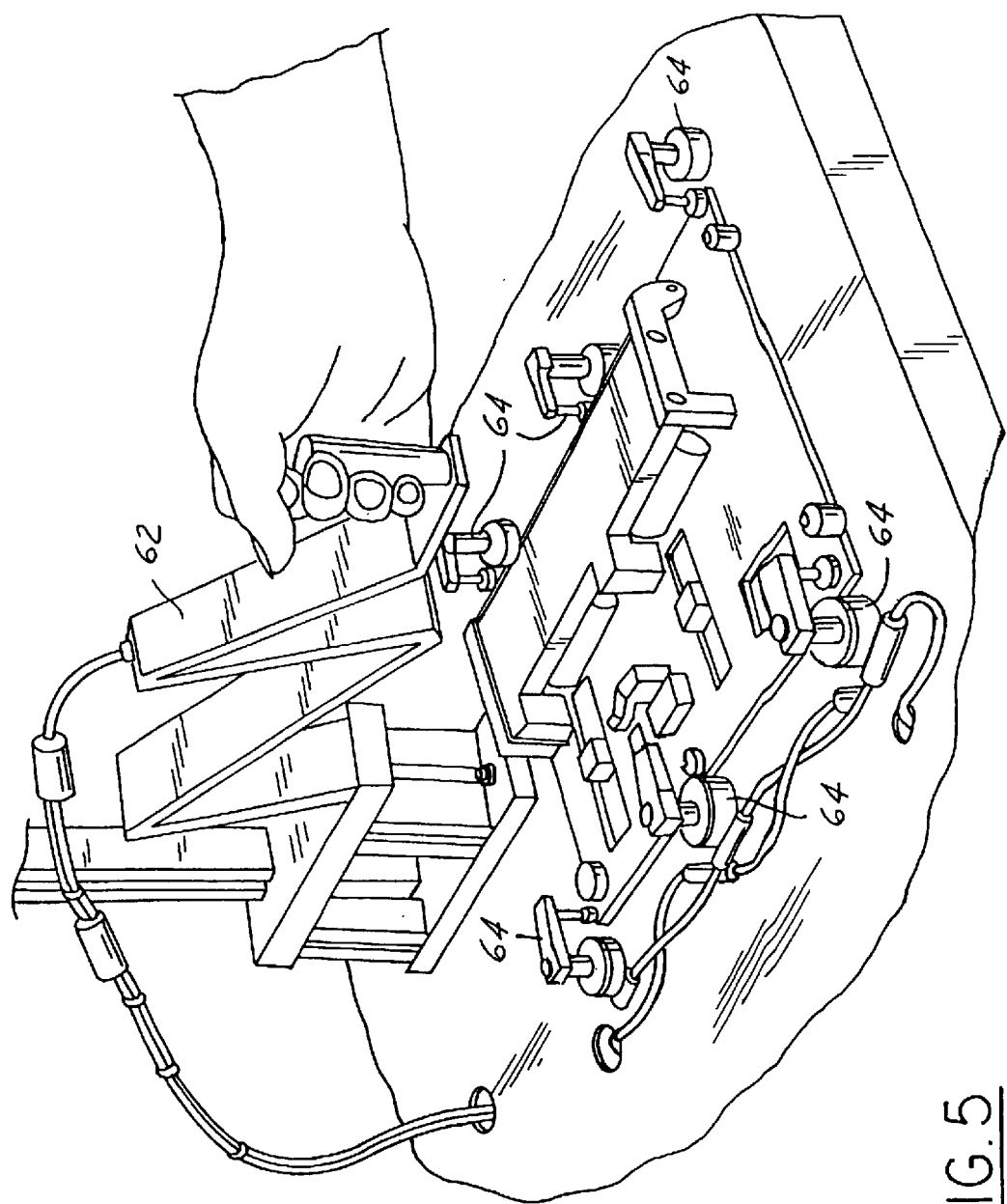
FIG. 5 is a top view detail of the lead test assembly illustrated in FIG. 1, the lead test assembly illustrated in a board restrained position.

One sequence of operations is conceived as follows. An operator loads a pallet 60 holding the populated circuit board 16 into the lead test assembly 10 (see FIG. 4). The pallet 60 can be utilized, as is known, to hold the circuit board 16 and plurality of electronic components 18 securely together. A barcode scanner 62 can be pulled out to read FIS labels or other identification from the circuit board 16 (see FIG. 5). The lead test assembly 10 then clamps down the pallet 60 and engages the air slide 28. Although a variety of securing assemblies 14 are contemplated by the present invention, FIGS. 4 and 5 illustrate an embodiment consisting of a plurality of clamping elements 64. Once the air slide 28 has been activated and the movable sensor assembly 22 is moved into the test active position 26, the results sent to the processor 30 can be displayed on an interface panel 66. The pallet 60 is then unclamped and the sequence is complete. It should be understood that the aforementioned sequential procedure is only a single embodiment of the method of use of the lead test assembly 10 contemplated by the present invention.

While particular embodiments of the invention have been shown and described, numerous variations and alternative embodiments will occur to those skilled in the art. Accordingly, it is intended that the invention be limited only in terms of the appended claims.

What is claimed is:

1. A lead tester assembly for use with a circuit board populated with a plurality of electronic components each including at least one lead protruding through the circuit board comprising:

a conductive plate element positioned below the circuit board and movable between a test active position and a test inactive position;

at least one sleeve element mounted to and in electrical communication with said conductive plate element;

a movable sensor in electrical communication with the at least one sleeve element when said conductive plate element is in said test inactive position; and a non-conductive probe slidably positioned within said at least one sleeve element, said non-conductive probe movable between a lead absent position and a lead present position;

wherein upon said non-conductive probe engaging one of the leads said non-conductive probe forces said movable sensor out of electrical communication with said at least one sleeve element.

2. A lead tester assembly as described in claim 1, wherein said at least one sleeve element further comprises:

an elbow portion;

a sleeve adjustment screw mounted in said elbow portion and controlling the height of said non-conductive probe above said conductive plate element.

3. A lead tester assembly as described in claim 2, wherein said at least one sleeve element further comprises:

a sleeve spring surrounding said sleeve adjustment screw, said sleeve spring biasing said at least one sleeve element against said sleeve adjustment screw.

4. A lead tester assembly as described in claim 1, wherein said at least one sleeve element is gold plated.

5. A lead tester assembly as described in claim 1, further comprising:

a sensor mounting base mounted to said conductive plate element, said movable sensor mounted on said sensor mounting base.

6. A lead tester assembly as described in claim 1, further comprising:
an air slide in communication with said conductive plate element, said air slide capable of moving said conductive plate between said test active position and said test inactive position.

7. A lead tester assembly as described in claim 6, wherein said air slide further comprises:
an adjustable stop mounted on a thread, said adjustable stop allowing adjustment of said test active position.

8. A lead tester assembly as described in claim 1, further comprising:
a securing assembly securing the circuit board to a base assembly.

9. A lead tester assembly as described in claim 1, further comprising:
a processor in electrical communication with said conductive plate element and said movable sensor such that said processor monitors when said movable sensor is moved out of electrical communication with said at least one sleeve element.

10. A lead tester assembly as described in claim 1, further comprising:
an interface panel in communication with said processor and displaying results from said processor.

11. A lead tester assembly as described in claim 1, further comprising:
a bar code scanner in communication with said processor, said bar code scanner identifying the circuit board.

12. A lead tester assembly as described in claim 1, wherein said non-conductive probe comprises a bakelite rod.

13. A lead tester assembly as described in claim 12, wherein said non-conductive probe includes a hardened steel tip.

14. A lead tester assembly as described in claim 9, wherein said processor includes a PLC input module.

15. A lead tester assembly for use with a circuit board populated with a plurality of electronic components each including at least one lead protruding through the circuit board comprising:
a conductive plate element positioned below the circuit board and movable between a test active position and a test inactive position;
a sensor mounting base positioned below and mounted to said conductive plate element;
at least one conductive sleeve element mounted to and in electrical communication with said conductive plate element;
a spring contact sensor mounted on said sensor mounting base and in electrical communication with the at least one conductive sleeve element when said conductive plate element is in said test inactive position; and
a non-conductive probe slidably positioned within said at least one sleeve element, said non-conductive probe movable from a lead absent position to a lead present position upon said non-conductive probe engaging the at least one lead, said non-conductive probe forcing said spring contact sensor out of electrical communication with said at least one sleeve element when in said lead present position.

16. A lead tester assembly as described in claim 15, wherein said at least one sleeve element further comprises:
an elbow portion;
a sleeve adjustment screw mounted in said elbow portion and controlling the height of said non-conductive probe above said conductive plate element; and
a sleeve spring surrounding said sleeve adjustment screw, said sleeve spring biasing said at least one sleeve element against said sleeve adjustment screw.

17. A lead tester assembly as described in claim 15, further comprising:
an air slide in communication with said conductive plate element, said air slide capable of moving said conductive plate between said test active position and said test inactive position.

18. A lead tester assembly as described in claim 17, wherein said air slide further comprises:
an adjustable stop mounted on a thread, said adjustable stop allowing adjustment of said test active position.

19. A lead tester assembly as described in claim 15, further comprising:
a processor in electrical communication with said conductive plate element and said spring contact sensor such that said processor monitors when said spring contact sensor is moved out of electrical communication with said at least one conductive sleeve element.

20. A lead tester assembly as described in claim 19, further comprising:
a bar code scanner in communication with said processor, said bar code scanner identifying the circuit board.

* * * * *